(12) United States Patent
Lee et al.

(10) Patent No.: US 8,692,215 B2
(45) Date of Patent: Apr. 8, 2014

(54) HEATED ROTARY SEAL AND BEARING FOR CHILLED ION IMPLANTATION SYSTEM

(75) Inventors: William D. Lee, Newburyport, MA (US); William DiVergilio, Cambridge, MA (US); Steve Drummond, Merrimac, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 25 days.

(21) Appl. No.: 13/116,661

(22) Filed: May 26, 2011

(65) Prior Publication Data

US 2011/0291023 A1 Dec. 1, 2011

Related U.S. Application Data

(60) Provisional application No. 61/349,571, filed on May 28, 2010.

(51) Int. Cl.
*H01J 37/20* (2006.01)
*H01J 29/00* (2006.01)

(52) U.S. Cl.
USPC .................................. 250/492.21; 250/492.3

(58) Field of Classification Search
USPC ................ 250/492.2, 492.21, 492.3; 384/476
See application file for complete search history.

(56) References Cited

U.S. PATENT DOCUMENTS

| | | | |
|---|---|---|---|
| 4,948,269 A * | 8/1990 | Hamilton | 384/467 |
| 5,636,098 A | 6/1997 | Salfelder et al. | |
| 5,754,391 A | 5/1998 | Bates | |
| 5,838,528 A | 11/1998 | Os et al. | |
| 5,975,536 A | 11/1999 | Helgeland | |
| 6,025,602 A | 2/2000 | Rose et al. | |
| 6,108,189 A | 8/2000 | Weldon et al. | |
| 6,433,346 B1 | 8/2002 | Hirayanagi | |
| 6,552,892 B2 | 4/2003 | Carroll et al. | |
| 6,570,752 B2 | 5/2003 | Morita et al. | |
| 6,629,423 B1 | 10/2003 | Hirooka et al. | |
| 6,684,652 B2 | 2/2004 | Kim et al. | |
| 7,033,443 B2 | 4/2006 | Kellerman et al. | |
| 7,105,838 B2 | 9/2006 | Naylor-Smith et al. | |
| 7,135,691 B2 * | 11/2006 | Vanderpot et al. | 250/492.1 |

(Continued)

OTHER PUBLICATIONS

Final Office Action dated Feb. 14, 2012 issued to U.S. Appl. No. 12/113,091.

(Continued)

*Primary Examiner* — Robert Kim
*Assistant Examiner* — David E Smith
(74) *Attorney, Agent, or Firm* — Eschweiler & Associates, LLC

(57) ABSTRACT

A workpiece scanning system is provided having a scan arm that rotates about a first axis and a chilled end effector rotatably coupled to the scan arm about a second axis for selectively securing a workpiece. The chilled end effector has a clamping plate and one or more cooling mechanisms for cooling the clamping plate. A bearing is positioned along the second axis and rotatably couples the end effector to the scan arm, and a seal is positioned along the second axis to provide a pressure barrier between an external environment and an internal environment. One or more of the bearing and seal can have a ferrofluid associated therewith. A heater assembly is positioned proximate to the bearing and seal, wherein the heater assembly selectively provides a predetermined amount of heat to the bearing and seal, therein increasing a propensity of the end effector to rotate about the second axis.

15 Claims, 5 Drawing Sheets

(56) References Cited

U.S. PATENT DOCUMENTS

| | | | |
|---|---|---|---|
| 7,323,695 | B2 | 1/2008 | Vanderpot et al. |
| 7,560,705 | B2 | 7/2009 | Eiriksson et al. |
| 7,697,260 | B2 | 4/2010 | Brown et al. |
| 2001/0005595 | A1 | 6/2001 | Morita et al. |
| 2003/0161088 | A1 | 8/2003 | Migita |
| 2003/0221626 | A1 | 12/2003 | Leavitt et al. |
| 2004/0066601 | A1 | 4/2004 | Larsen |
| 2005/0121144 | A1 | 6/2005 | Edo et al. |
| 2005/0219786 | A1 | 10/2005 | Brown et al. |
| 2005/0263719 | A1 | 12/2005 | Ohdaira et al. |
| 2006/0060259 | A1 | 3/2006 | Devitt |
| 2006/0171094 | A1 | 8/2006 | Muka et al. |
| 2006/0219605 | A1 | 10/2006 | Devitt |
| 2007/0109714 | A1 | 5/2007 | Chung |
| 2008/0044938 | A1 | 2/2008 | England et al. |
| 2008/0105836 | A1* | 5/2008 | Eiriksson et al. .......... 250/522.1 |
| 2008/0137812 | A1* | 6/2008 | Frontera et al. .............. 378/130 |
| 2008/0144251 | A1 | 6/2008 | Tao et al. |
| 2009/0067114 | A1 | 3/2009 | Balan |
| 2009/0273878 | A1 | 11/2009 | Lee et al. |
| 2009/0277883 | A1 | 11/2009 | Tandou et al. |
| 2010/0090413 | A1 | 4/2010 | Mahoney et al. |
| 2010/0164303 | A1* | 7/2010 | Veneruso ........................ 310/11 |
| 2010/0171044 | A1 | 7/2010 | Lee et al. |
| 2010/0181500 | A1 | 7/2010 | Chang et al. |
| 2011/0062806 | A1 | 3/2011 | Ohashi et al. |
| 2011/0291022 | A1 | 12/2011 | Lee et al. |
| 2011/0291023 | A1 | 12/2011 | Lee et al. |
| 2011/0291030 | A1 | 12/2011 | Lee |

OTHER PUBLICATIONS

Notice of Allowance Dated Apr. 6, 2009 for U.S. Appl. No. 11/840,888. 19 Pages.
U.S. Appl. No. 11/840,888, filed Aug. 17, 2007. 27 Pages.
U.S. Appl. No. 12/725,508, filed Mar. 17, 2010. 21 Pages.
U.S. Appl. No. 13/485,186, filed May 31, 2012. 20 Pages.
U.S. Appl. No. 11/641,334, filed Dec. 19, 2006. 32 Pages.
U.S. Appl. No. 12/113,091, filed Apr. 30, 2008. 32 Pages.
U.S. Appl. No. 13/150,822, filed Jun. 1, 2011. 34 Pages.
Non-Final Office Action Dated Sep. 9, 2009 for U.S. Appl. No. 11/641,334, 16 pages.
Final Office Action dated Mar. 19, 2010 for U.S. Appl. No. 11/641,334. 18 pages.
"Porous Media Technology", New Way Air Bearings, Jan. 30, 2008, reprinted from the Internet at: http://www.newwayairbearings.com/porous-media-technology , 1 page.
Non-Final Office Action Dated Jun. 16, 2011 for U.S. Appl. No. 12/113,091. 14 Pages.
Non-Final Office Action Dated Oct. 18, 2011 for U.S. Appl. No. 12/725,508.
Final Office Action Dated Mar. 30, 2012 for U.S. Appl. No. 12/725,508.
Office Action dated Dec. 20, 2012 for U.S. Appl. No. 13/150,822.
Notice of Allowance dated Dec. 11, 2012 issued to U.S. Appl. No. 11/641,334.
Notice of Allowance dated Mar. 6, 2013 for U.S. Appl. No. 13/150,822.
Final Office Action dated Jul. 8, 2013 for U.S. Appl. No. 13/485,186.
Office Action dated Mar. 20, 2013 for U.S. Appl. No. 13/485,186.
Office Action dated Sep. 11, 2013 for U.S. Appl. No. 12/113,091.

* cited by examiner

HEATED ROTARY SEAL AND BEARING FOR CHILLED ION IMPLANTATION SYSTEM

REFERENCE TO RELATED APPLICATION

This application claims priority to and the benefit of U.S. Provisional Application Ser. No. 61/349,571 which was filed May 28, 2010, entitled "HEATED ROTARY SEAL AND BEARING FOR CHILLED ION IMPLANTATION SYSTEM", the entirety of which is hereby incorporated by reference as if fully set forth herein.

FIELD OF THE INVENTION

The present invention relates generally to ion implantation systems, and more specifically to warming a heated seal and/or bearing used in an ion implantation system having one or more chilled components.

BACKGROUND OF THE INVENTION

In the manufacture of semiconductor devices and other products, ion implantation systems are used to implant dopant elements into workpieces (e.g., semiconductor wafers, display panels, glass substrates). These ion implantation systems are typically referred to as "ion implanters".

Absent countermeasures, during the ion implantation process, energy can build up on the workpiece in the form of heat as the charged ions collide with the workpiece. This heat can warp or crack the workpiece, which may render the workpiece worthless (or significantly less valuable) in some implementations.

In addition, even if the workpiece is not rendered worthless, this undesired heating can cause the dose of ions delivered to differ from the dosage desired, which can alter the functionality from what is desired. For example, if a dose of $1 \times 10^{17}$ atoms/cm$^3$ are desired to be implanted in an extremely thin region just below the outer surface of the workpiece, unexpected heating could cause the delivered ions to diffuse out from this extremely thin region such that the dosage actually achieved is less than $1 \times 10^{17}$ atoms/cm$^3$. In effect, the undesired heating can "smear" the implanted charge over a larger region than desired, thereby reducing the effective dosage to less than what is desired. Other undesirable effects could also occur.

In other instances it might be desirable to implant at a temperature below ambient temperature, to allow for desirable amorphization of the silicon wafer surface enabling ultra shallow junction formation in advanced CMOS integrated circuit device manufacturing.

For these and other reasons, cooling systems have been developed to allow the chuck to be cooled to very low temperatures. Although cooling systems are known in some respects, such as in plasma processing apparatuses, it is extremely difficult to integrate a vapor cooling system into an ion implanter due to the mechanical density of components near the workpiece. For example, electrostatic chucks in ion implanters are often considerably more complicated that those used in less complicated plasma processing apparatuses. The inventors have developed techniques and systems for cooling electrostatic chucks in ion implantation systems, which can reduce undesired heating of workpieces undergoing implantation. Other methods for cooling an electrostatic chuck could comprise circulating a chilled fluid through the chuck at roughly, or slightly below, the temperature desired for implant.

SUMMARY OF THE INVENTION

The inventors have found that upon cooling an electrostatic chuck, a rotation or "twist" of the electrostatic chuck may be adversely affected by the cooling, wherein seals and/or bearings are cooled and viscosity of fluids involved therein is deleteriously increased. Therefore, a mechanism for heating a seal and/or bearing within cooled components of an ion implantation system is provided herein, wherein the seal and/or bearing maintains the desired propensity to rotate.

Thus, the present disclosure overcomes the limitations of the prior art by providing a system, apparatus, and method for providing heat to a seal and/or bearing in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure is directed generally toward a heated seal and/or bearing in an ion implantation system, and in one particular example, to a seal and/or bearing in an ion implantation workpiece scanning system. The ion implantation workpiece scanning system, for example, comprises a scan arm configured to rotate about a first axis and an end effector that is rotatably coupled to the scan arm and configured to selectively secure a workpiece. The end effector may be optionally chilled to enable low temperature ion implantation. The end effector is configured to rotate about a second axis, wherein the first axis and second axis are positioned a predetermined distance apart, and wherein the end effector comprises a clamping plate such as an electrostatic chuck. One or more cooling mechanisms can be provided for cooling the clamping plate.

A bearing is positioned along the second axis, wherein the bearing rotatably couples the end effector to the scan arm, and a seal is positioned along the second axis, wherein the seal generally provides a pressure barrier between an external environment and an internal environment associated with an internal region of one or more of the scan arm and end effector. One or more of the bearing and seal can comprise a ferrofluidic seal. A heater assembly is positioned proximate to the bearing and seal, wherein the heater assembly is configured to selectively provide a predetermined amount of heat to the bearing and seal, thereby decreasing the viscosity of the fluid, thus increasing a propensity of the end effector to rotate about the second axis.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
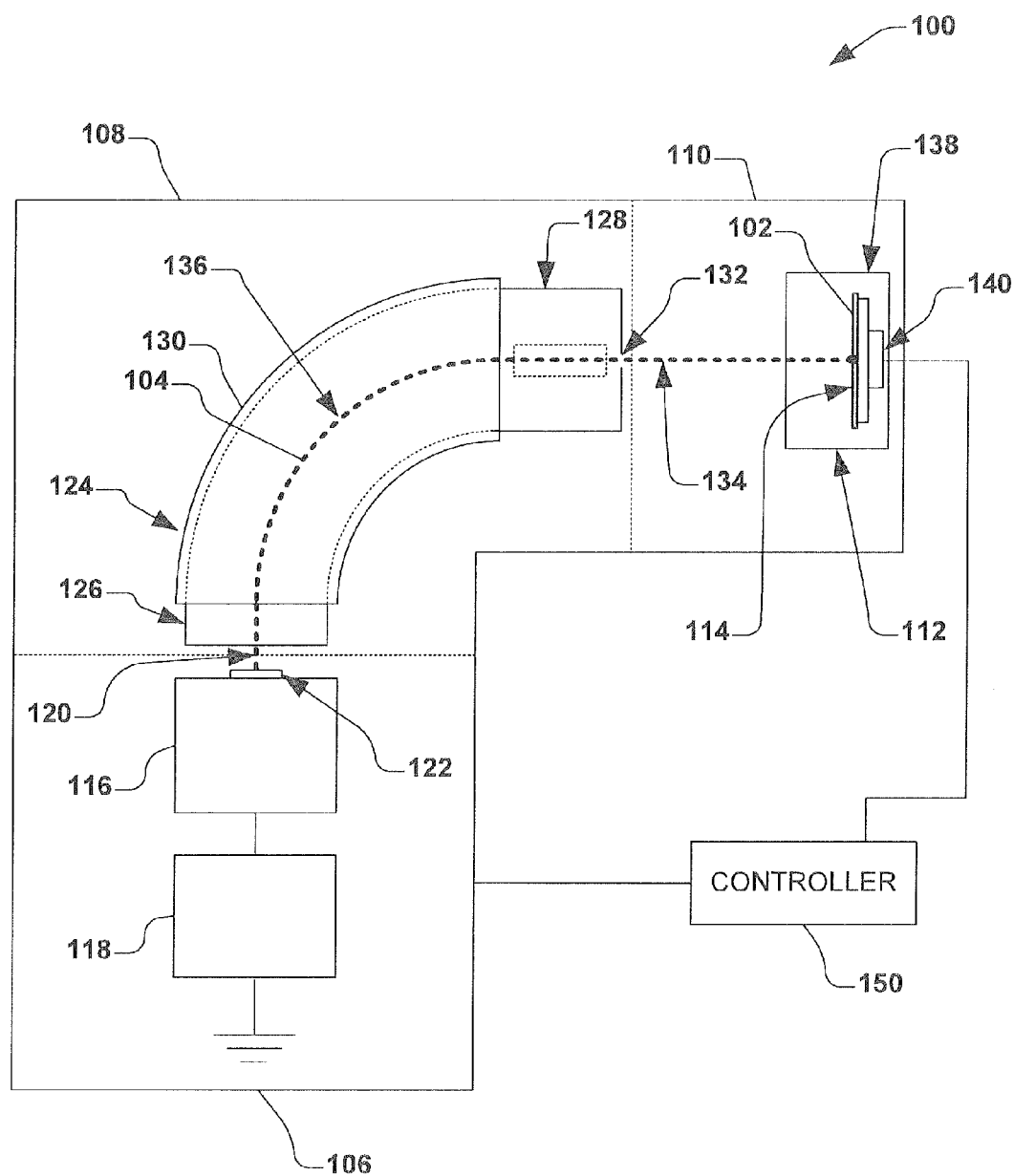
FIG. 1 illustrates a block diagram of an exemplary ion implantation system.

The present invention is directed generally toward a scan arm in an ion implantation system, and more particularly, to a heating mechanism for heating one or more of a seal and bearing on an end effector configured to rotate about an axis on the scan arm. It will be understood that such heating may be particularly desirable in an ion implantation system that is adapted to provide low temperature implantation, wherein such low temperature adaptation creates a need for increasing the temperature of seals and bearings to maintain the mobility therein, however, the present invention may be equally adaptable to ion implantation systems that are not adapted to provide low temperature implantation. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

The present invention provides a solution to a problem that arose in adapting an ion implantation system to be configured to operate at temperatures lower than ambient temperature, wherein various moving components can freeze up and potentially fail, or at least fail to perform adequately. Specifically, bearings and seals that contain oils, hydrocarbons, fluorocarbons, or other types of grease, can require great amounts of torque to overcome the increase in viscosity as they cool down. The present disclosure overcomes this problem by providing a heating source to maintain a temperature of the seal and or bearing. Once again, however, it will be understood that while such heating may be particularly desirable in an ion implantation system that is adapted to provide low temperature implantation, wherein such a low temperature adaptation creates a need for increasing the temperature of seals and bearings to maintain the mobility therein, the present disclosure may be equally adaptable to ion implantation systems that are not specifically adapted to provide low temperature implantation.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or wafer) relative to an ion beam 104, therein implanting ions into the workpiece. As stated above, various aspects of the present invention may be implemented in association with any type of ion implantation apparatus, including, but not limited to the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. An ion source 116 in the terminal 106 is powered by a power supply 118 to provide an extracted ion beam 120 (e.g., an undifferentiated ion beam) to the beamline assembly 108, wherein the ion source comprises one or more extraction electrodes 122 to extract ions from the source chamber and thereby to direct the extracted ion beam toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 120 and creates a dipole magnetic field to pass only ions of appropriate energy-to-mass ratio or range thereof through a resolving aperture 132 to the workpiece 102. The ions passed through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example, the desired ion beam 134 is directed toward the workpiece 102, wherein the workpiece is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor wafer, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. It should be noted, however, that batch or other type end stations may alternatively be employed, wherein multiple workpieces 102 may be scanned simultaneously, and such end stations are contemplated as falling within the scope of the present invention.

In another example, the system 100 may comprise an electrostatic beam scanning system (not shown) operable to scan the ion beam 104 along one or more scan planes relative to the workpiece 102. Accordingly, the present invention further contemplates any scanned or non-scanned ion beam 104 as falling within the scope of the present invention. In accordance with one embodiment of the present invention, the workpiece scanning system 138 of FIG. 1 comprises a scan arm 140, wherein the scan arm is configured to reciprocally scan the workpiece 102 with respect to the ion beam 104. The ion implantation system 100, for example, is further controlled by a controller 150, wherein functionality of the ion implantation system and workpiece scanning system 138 is controlled via the controller.

Figure 2:
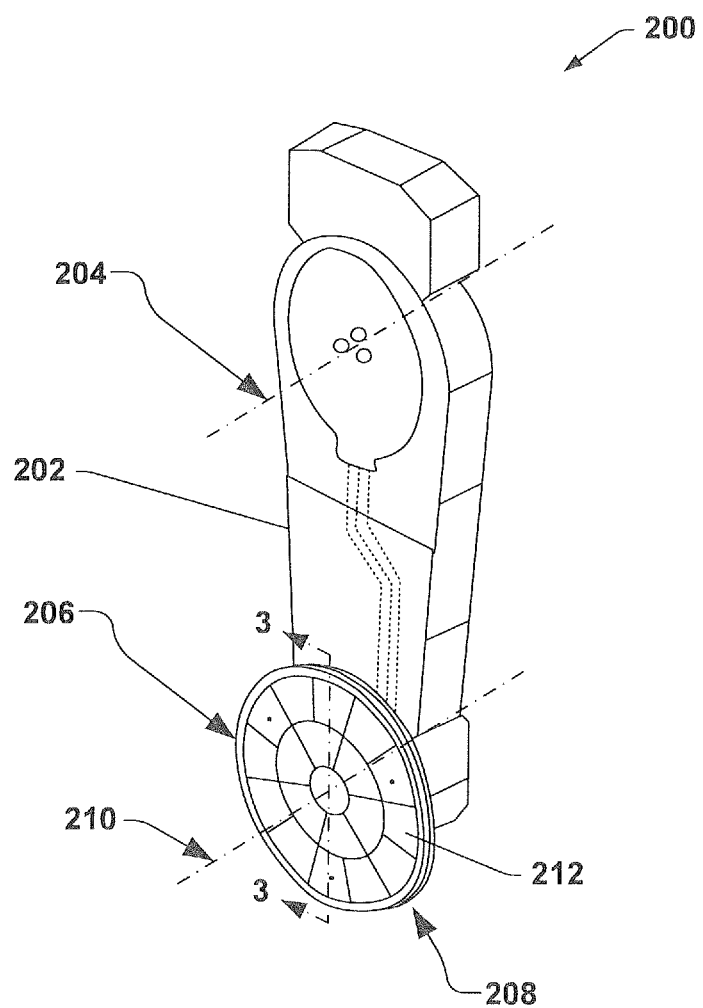
FIG. 2 illustrates an exemplary workpiece scanning system in accordance with one aspect of the invention.

FIG. 2 illustrates an ion implantation workpiece scanning system 200, wherein the scanning system comprises an exemplary scan arm 202 configured to rotate about a first axis 204 in accordance with another aspect of the invention. The scanning system 200 further comprises a chilled end effector 206 rotatably coupled to an end 208 of the scan arm 202 and configured to selectively secure a workpiece (not shown), wherein the chilled end effector is further configured to rotate about a second axis 210, wherein the first axis 204 and second axis are positioned a predetermined distance apart. The chilled end effector 206 comprises a clamping plate 212 (e.g., an electrostatic chuck) and one or more cooling mechanisms 214 configured to cool the clamping plate. It will be understood that while the present invention is described in connection with the ion implantation workpiece scanning system 200 of FIG. 2, wherein the exemplary scanning system comprise the exemplary scan arm 202 configured to rotate about the first axis 204 for translating the workpiece 102 of FIG. 1 through the ion beam 104, the invention is equally applicable to any ion implantation workpiece scanning system configured to laterally and/or arcuately translate the workpiece through the ion beam, and all such scanning systems are contemplated as falling within the scope of the present invention. Several exemplary aspects of the scan arm 202 and chilled end effector 206 are described in co-owned U.S. Pat. No. 7,560,705, entitled "Workpiece Handling Scan Arm for Ion Implantation System", and U.S. Non-provisional patent application Ser. No. 12/725,508, entitled "Vapor Compression Refrigeration Chuck for Ion Implanters", the contents of which are incorporated by reference herein, in their entireties.

Figure 3:
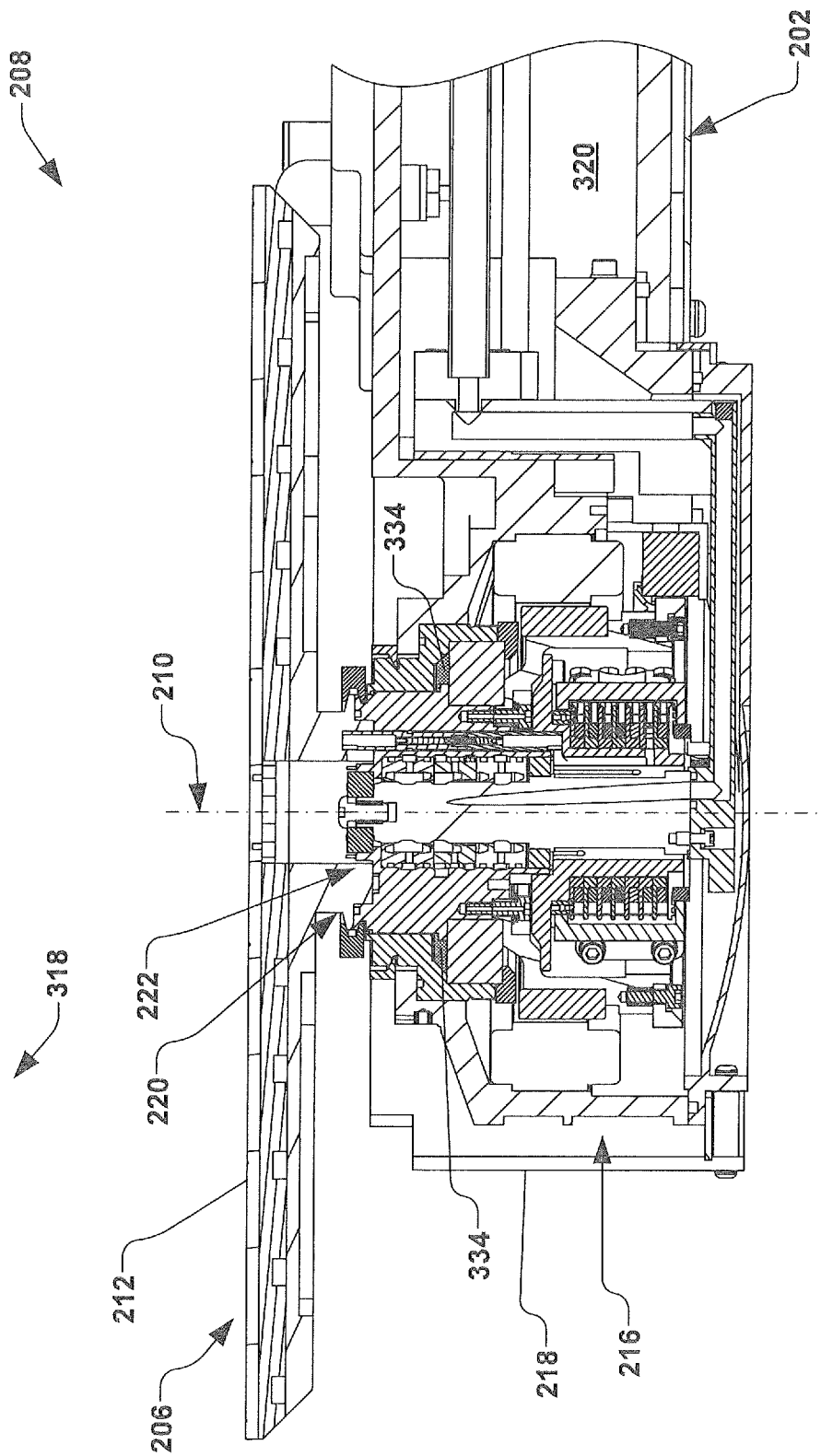
FIG. 3 illustrates a cross-sectional view of an end of an exemplary scan arm in accordance with another aspect of the invention.

FIG. 3 illustrates an enlarged view of the end 208 of the scan arm 202 of FIG. 2, wherein various features of the present example are illustrated in greater detail. For example, the scan arm 202 comprises a twist head 216 configured to provide both cooling of the clamping plate 212 and selectively rotate the clamping plate about the second axis 210. The twist head 216, for example, comprises an enclosure 218 that is generally fixed with respect to the scan arm 202. A wedge mount 220 is further provided, wherein the wedge mount operably couples the end effector 206 to a rotatable shaft 222 of the twist head 216. The rotatable shaft 222 is operable to rotate about the second axis 208 with respect to the enclosure 218 of the twist head 216, thus providing rotation to the wedge mount 220 and associated clamping plate 212.

Figure 4:
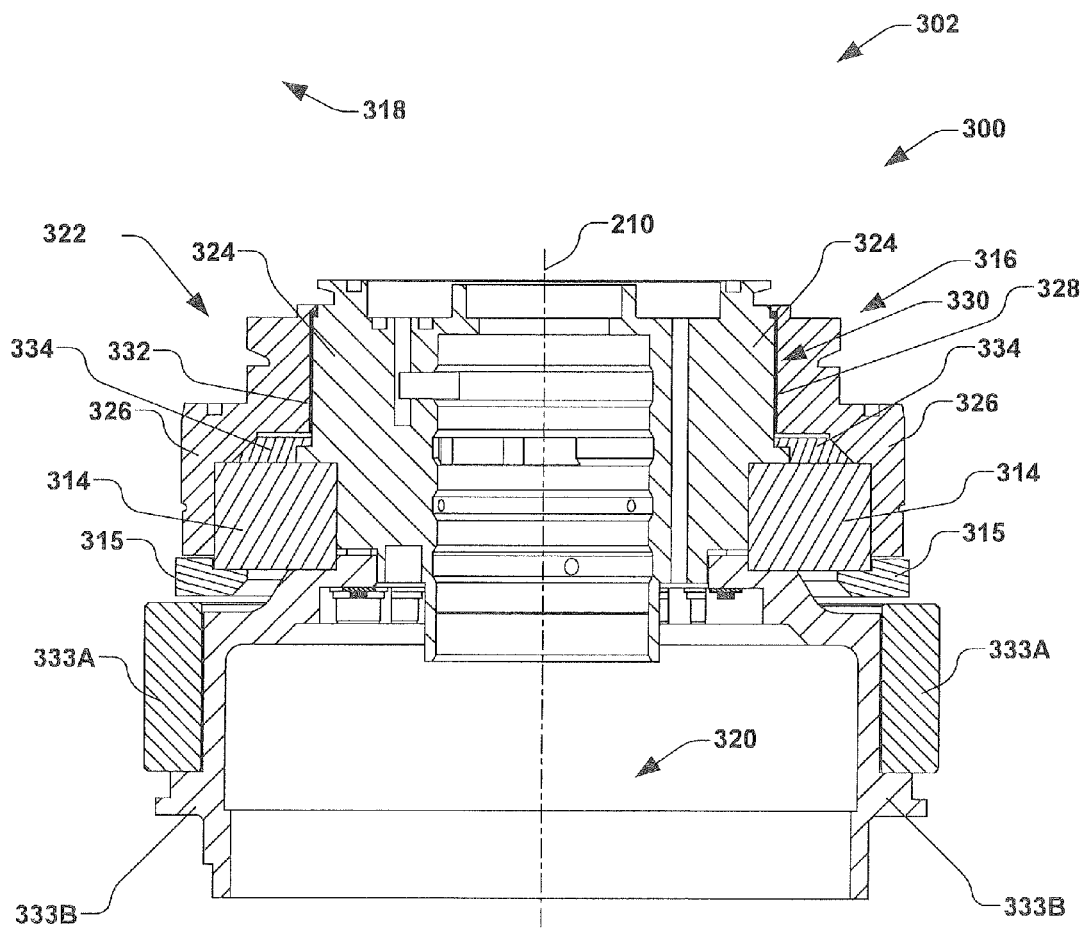
FIG. 4 illustrates a partial cross section of an exemplary end effector in accordance with yet another aspect of the invention.

In accordance with one exemplary aspect of the disclosure, FIG. 4 illustrates a portion 300 of another exemplary twist head 302, such as that illustrated in FIG. 3, wherein various components such as the clamping plate 212 and wedge mount 220 are removed for clarity. As illustrated in FIG. 4, a bearing assembly 314 is positioned along the second axis 210, wherein the bearing rotatably couples the end effector 206 to the scan arm 202 of FIG. 3. The bearing assembly 314, for example, comprises a cross roller-bearing held by a bearing retainer 315, wherein lubricating oil and/or grease is disposed therein for maintaining a low-friction lubrication of the bearing. A seal assembly 316 illustrated in FIG. 4 is further positioned along the second axis 210, wherein the seal assembly generally provides a pressure barrier between an internal environment 318 of the process chamber (e.g., the process chamber 112 of FIG. 1) and an external environment 320 (e.g., atmospheric) associated with an internal region of one or more of the scan arm 202 and end effector 206 of FIG. 3.

The seal assembly 316 of FIG. 4, for example, comprises a ferrous liquid rotary seal assembly 322 configured to provide a rotary, hermetic seal between the external environment 320 and internal environment 318. For example, the ferrous liquid rotary seal assembly 322 comprises a rotor 324 operably coupled to the chilled end effector 206 of FIG. 3, and is configured to rotate about the second axis 210 of FIG. 4. A stator 326 is further positioned along the second axis 210 and configured to rotate the rotor 324, such as by a plurality of azimuthally-oriented magnets (not shown). One or more passages 328 are provided, such as an annular region 330 between the rotor 324 and stator 328 wherein a ferrofluid 332, for example, resides within the one or more passages 328.

Accordingly, the magnets of the stator 326 in the present example provide a magnetic field that crosses radially through the ferrofluid 332, and the magnetic flux returns through rotor 324 of the magnetic liquid rotary seal assembly 322 then back to the magnets of the stator 326. The ferrofluid 332, for example, is a type of oil with extremely fine iron particles disposed therein. The magnets of the stator 326, for example, cause the ferrofluid to align radially due to magnetization while sitting in magnetic field, thus providing a high degree of resistance to motion along the second axis 210 along this seal, thus providing a strong seal.

Furthermore, a number of chambers (not shown) are provided in the annular region 330, wherein, for example, each of the chambers are operable to hold off 1-3 psi of pressure between the external environment 320 and internal environment 318. Accordingly, when a plurality of chambers provided, a sufficient sealing is provided to seal the internal environment 318 (e.g., atmosphere at the lower side of seal) from the external environment 320 (e.g., vacuum at the upper side of seal). Since the magnetic field is in the direction of the rotation of the end effector 206 of FIG. 3 (e.g., radially), generally free rotation with minimal resistance is possible in the internal environment 318 (e.g., vacuum), while maintaining the sealing from the external environment 320 (e.g., atmosphere).

Lowering of the temperature of the chilled end effector 206 of FIG. 3, however, causes the viscosity of the fluid to increase. In order to achieve rotation of the chilled end effector 206, the rotor of a motor 333A, 333B of FIG. 4 is operably coupled thereto. The motor 333, for example, has a torque limit associated therewith that cannot be exceeded without the motor faulting. Thus, as the temperature of the chilled end effector 206 decreases (e.g., by internal cooling passages, etc., not shown), the viscosity of the ferrofluid and/or lubricating fluid in the seal assembly 316 increases, and the rotation can be deleteriously affected.

Accordingly, a heater assembly 334 is positioned proximate to the bearing assembly 314 and seal assembly 316, wherein the heater assembly is configured to selectively provide a predetermined amount of heat to the bearing and seal assemblies, therein decreasing a viscosity of the lubricating fluid and increasing a propensity of the chilled end effector 206 of FIG. 3 to rotate about the second axis 210.

The heater assembly 334 of FIG. 4, for example, is configured to provide energy (e.g., 100-120 W, up to or greater than 200 W), which is sufficient to locally heat the seal assembly 314, and thus keep the lubricating fluid (e.g., the ferrofluid, bearing grease, etc.) at a temperature where the viscosity is sufficiently low that viscous drag can be overcome by the torque allowable from the motor 333. The viscosity of the lubricating oil/grease in the bearing assembly 314 can be likewise decreased by the heater assembly 334. The heater assembly 334, for example, regionally heats the chilled end effector 206 of FIG. 3, wherein the amount of heat provided by the heater assembly is controlled so as to provide the advantageous lower viscosity in the lubricating fluid, while not deleteriously affecting the desired cooling at the clamping plate 212 (e.g., the electrostatic chuck) and/or workpiece residing thereon.

Accordingly, as some of the passageways (not shown) utilized for the supply/return of cooling fluid to the clamping plate 212 of FIG. 3 are operated at very low temperatures (e.g., −50/−60 C), the heater assembly 334 of FIG. 4 is operable to maintain the cooling fluid at a relatively cold temperature while providing an acceptable amount of heat (e.g., 100 W) at the radius/location where the ferrofluidic seal (the seal assembly 316) is positioned. Thus, the structure of the end effector 206 reasonably insulates the cooling fluid, thus maintaining its cold temperature, while warming the ferrofluid and bearing regions. The inventors contemplate that a threshold temperature (e.g., −20 C) be maintained at the seal assembly 322 to avoid freezing of the seal assembly and/or bearing assembly 314, as well as taking the torque ability of the motor into consideration.

For example, the power to be provide to the heater assembly is relatively low, such as 2-3 Watts per degree centigrade between the cooling fluid and the seal surface. Table 1, for example, shows input power to the seal assembly 316 with change in temperature from the cooling fluid to the stator 326.

TABLE 1

| Input Power (W) | ΔT (° C.) | Thermal Fluid Return Temp. (° C.) | Ferroseal Stator Temp. (° C.) | Power/ΔT (W/° C.) |
|---|---|---|---|---|
| 0 | 5 | −13 | −8 | 0.00 |
| 22 | 11 | −13 | −2 | 2.00 |
| 32 | 14 | −12 | 2 | 2.29 |
| 45 | 20 | −12 | 8 | 2.25 |

The seal assembly 316, for example, is configured to operate at a temperature down to about −10° C. to −20° C. Thus, in the present example of the cooling fluid needing to be at −60° C., the power requirement to heat the seal assembly 316 is only 100 W to 150 W.

Accordingly, the present invention provides a mechanism for heating one or more of a bearing and seal associated with a rotation of a chilled end effector in an ion implantation system. It should be noted that while the examples illustrated in the above disclosure are directed toward a chilled end effector, various other implementations of heating a rotary seal and/or bearing in an ion implantation system are also contemplated as falling within the scope of the present invention.

Figure 5:
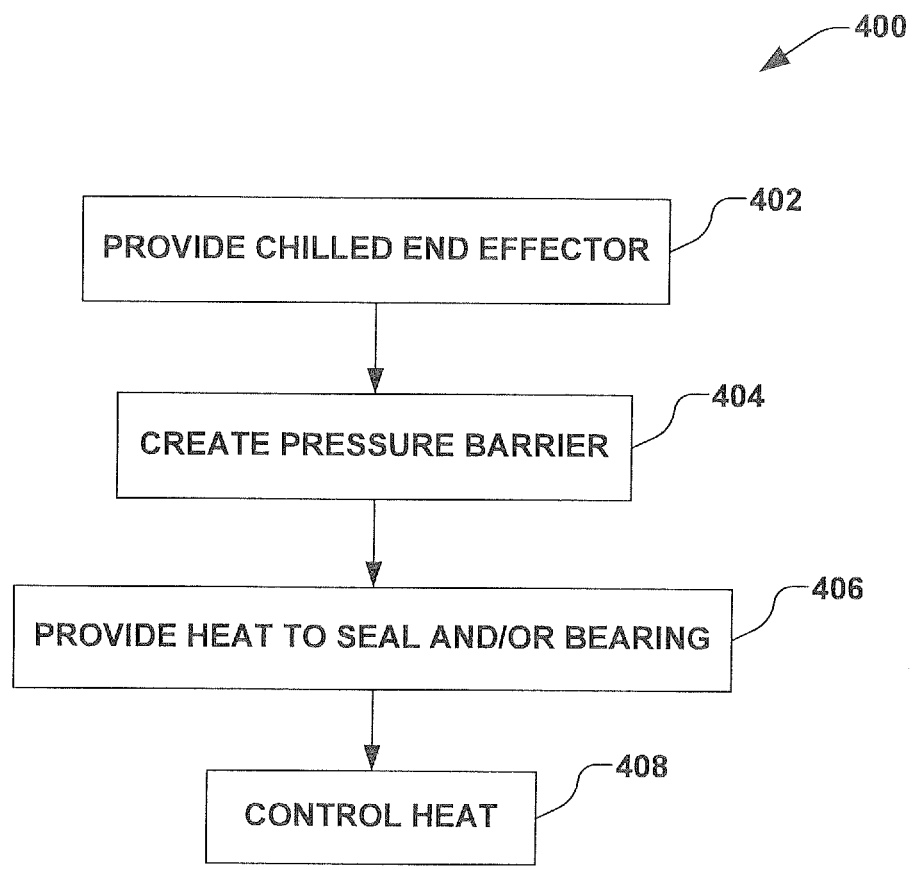
FIG. 5 is a method for heating a seal and/or bearing according to still another exemplary aspect of the invention.

In accordance with another exemplary aspect of the invention, FIG. 5 illustrates an exemplary method 400 for maintaining a rotational capacity of a chilled end effector. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 400 of FIG. 5 begins at act 402, wherein a chilled end effector is provided, wherein the chilled end effector is configured to rotate about an axis. The chilled end effector, for example, comprises the chilled end effector 206 of FIG. 3, and comprises a clamping plate and one or more cooling mechanisms configured to cool the clamping plate. In act 404 of FIG. 5, a pressure barrier is created between an external environment and an internal environment associated with an internal region of the chilled end effector via a bearing and/or seal positioned along the axis. In act 406, one or more of a bearing and a seal associated with the rotation of the end effector is heated, and the heating is controlled in act 408 to selectively provide a predetermined amount of heat to the bearing and seal, thereby increasing a propensity of the chilled end effector to rotate about the axis.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation workpiece scanning system, comprising:
a scan arm configured to rotate about a first axis;
a chilled end effector rotatably coupled to the scan arm and configured to selectively secure a workpiece, wherein the chilled end effector is further configured to rotate about a second axis, wherein the first axis and second axis are positioned a predetermined distance apart, and wherein the chilled end effector comprises a clamping plate and one or more cooling mechanisms configured to cool the clamping plate;
a bearing positioned along the second axis, wherein the bearing rotatably couples the end effector to the scan arm;
a seal positioned along the second axis, wherein the seal generally provides a pressure barrier between an external environment and an internal environment associated with an internal region of one or more of the scan arm and end effector, wherein the seal comprises a magnetic liquid rotary seal assembly configured to provide a rotary, hermetic seal between the external environment and internal environment, and wherein the magnetic liquid rotary seal assembly further comprises a motor comprising:
a rotor operably coupled to the chilled end effector and configured to rotate about the second axis;
a stator positioned along the second axis and configured to rotate the rotor; and
a ferrofluid disposed in an annular region between the rotor and stator, therein forming the seal; and
a heater assembly positioned proximate to the bearing and seal, wherein the heater assembly is configured to selectively provide a predetermined amount of heat to the bearing and seal, therein increasing a propensity of the end effector to rotate about the second axis.

2. The ion implantation workpiece scanning system of claim 1, wherein the heater assembly comprises an electric element having a heating power range of approximately 100 to 200 watts.

3. The ion implantation workpiece scanning system of claim 1, wherein the heater assembly comprises one or more fluid passages configured to circulate a heating fluid therethrough.

4. The ion implantation workpiece scanning system of claim 1, wherein the chilled end effector further comprises a chilled electrostatic chuck configured to selectively electrostatically clamp the workpiece to a clamping surface thereof.

5. The ion implantation workpiece scanning system of claim 1, wherein the first axis and second axis are parallel to one another.

6. The ion implantation workpiece scanning system of claim 1, wherein the one or more cooling mechanisms comprise one or more fluid channels configured to circulate a cooling fluid to the clamping plate.

7. An ion implantation workpiece scanning system, comprising:
   a scan arm configured to translate a workpiece across an ion beam;
   an end effector rotatably coupled to the scan arm and configured to selectively secure a workpiece, wherein the end effector is further configured to rotate about a twist axis, a bearing positioned along the twist axis, wherein the bearing rotatably couples the end effector to the scan arm;
   a seal positioned along the twist axis, wherein the seal generally provides a pressure barrier between an external environment and an internal environment associated with an internal region of one or more of the scan arm and end effector, and wherein the seal comprises a magnetic liquid rotary seal assembly configured to provide a rotary, hermetic seal between the external environment and internal environment, wherein the magnetic liquid rotary seal assembly further comprises a motor comprising:
      a rotor operably coupled to the end effector and configured to rotate about the twist axis;
      a stator positioned along the twist axis and configured to rotate the rotor; and
      a ferrofluid disposed in an annular region between the rotor and stator, therein forming the seal; and
   a heater assembly positioned proximate to the bearing and seal, wherein the heater assembly is configured to selectively provide a predetermined amount of heat to the bearing and seal, therein increasing a propensity of the end effector to rotate about the twist axis.

8. The ion implantation workpiece scanning system of claim 7, wherein the heater assembly comprises an electric element having a heating power in the range of 100 to 200 watts.

9. The ion implantation workpiece scanning system of claim 7, wherein the heater assembly comprises one or more fluid passages configured to circulate a heating fluid therethrough.

10. The ion implantation workpiece scanning system of claim 7, wherein the end effector further comprises a chilled electrostatic chuck configured to selectively electrostatically clamp the workpiece to a clamping surface thereof.

11. An ion implantation workpiece scanning system, comprising:
   a chilled end effector rotatably coupled to the scan system and configured to selectively secure a workpiece, wherein the chilled end effector is further configured to rotate about an axis, wherein the chilled end effector comprises a clamping plate and one or more cooling mechanisms configured to cool the clamping plate;
   a bearing positioned along the axis, wherein the bearing rotatably couples the chilled end effector to the scan system;
   a seal positioned along the axis, wherein the seal generally provides a pressure barrier between an external environment and an internal environment associated with an internal region of one or more of the scan arm and chilled end effector, and wherein the seal comprises a magnetic liquid rotary seal assembly configured to provide a rotary, hermetic seal between the external environment and internal environment, wherein the magnetic liquid rotary seal assembly further comprises a motor comprising:
      a rotor operably coupled to the chilled end effector and configured to rotate about the axis;
      a stator positioned along the axis and configured to rotate the rotator; and
      a ferrofluid disposed in an annular region between the rotor and stator, therein forming the seal; and
   a heater assembly positioned proximate to the bearing and seal, wherein the heater assembly is configured to selectively provide a predetermined amount of heat to the bearing and seal, thereby increasing a propensity of the chilled end effector to rotate about the axis.

12. The ion implantation workpiece scanning system of claim 11, wherein the heater assembly comprises an electric element having a heating power in the range of approximately 100 to 200 watts.

13. The ion implantation workpiece scanning system of claim 11, wherein the heater assembly comprises one or more fluid passages configured to circulate a heating fluid therethrough.

14. The ion implantation workpiece scanning system of claim 11, wherein the chilled end effector further comprises a chilled electrostatic chuck configured to selectively electrostatically clamp the workpiece to a clamping surface thereof.

15. A method for maintaining a rotational capacity of a chilled end effector, the method comprising:
   providing a chilled end effector configured to rotate about an axis, wherein the chilled end effector comprises a clamping plate and one or more cooling mechanisms configured to cool the clamping plate;
   creating a pressure barrier between an external environment and an internal environment associated with an internal region of the chilled end effector via a magnetic liquid rotary seal assembly positioned along the axis, wherein the magnetic liquid rotary seal assembly provides a rotary, hermetic seal between the external environment and internal environment via a ferrofluid disposed in an annular region between a rotor and a stator of a motor;
   heating the magnetic liquid rotary seal assembly; and
   controlling the heating to selectively provide a predetermined amount of heat to the magnetic liquid rotary seal assembly, thereby increasing a propensity of the chilled end effector to rotate about the axis.

* * * * *